United States Patent
Kinzelmann et al.

(10) Patent No.: US 6,350,344 B1
(45) Date of Patent: Feb. 26, 2002

(54) SOLVENTLESS PRIMERS WHICH ARE HARDENABLE BY RADIATION

(75) Inventors: Hans-Georg Kinzelmann, Cary, NC (US); Michael Drobnik, Duesseldorf (DE)

(73) Assignee: Henkel Kommanditgesellschaft auf Aktien, Duesseldorf (DE)

( * ) Notice: Subject to any disclaimer, the term of this patent is extended or adjusted under 35 U.S.C. 154(b) by 0 days.

(21) Appl. No.: 09/297,144

(22) PCT Filed: Oct. 17, 1997

(86) PCT No.: PCT/EP97/05752

§ 371 Date: Apr. 26, 1999

§ 102(e) Date: Apr. 26, 1999

(87) PCT Pub. No.: WO98/18868

PCT Pub. Date: May 7, 1998

(30) Foreign Application Priority Data

Oct. 26, 1996 (DE) .......................................... 196 44 590

(51) Int. Cl.[7] .............................. C09J 5/02; B32B 27/16; C08J 7/04; C08J 3/28; C08F 2/50
(52) U.S. Cl. ................................ 156/275.5; 156/275.7; 156/325; 156/327; 156/330; 156/331.1; 156/330.9; 427/505; 427/516; 428/40.1; 428/40.9; 428/41.2; 428/343; 428/344; 428/345; 428/355 R; 522/168; 522/170; 522/181; 522/182
(58) Field of Search ................................. 522/181, 182, 522/168, 170; 428/40.1, 40.9, 41.2, 343, 344, 345, 355 R; 427/505, 516; 156/275.5, 275.7, 325, 327, 330, 331.1, 330.9

(56) References Cited

U.S. PATENT DOCUMENTS

| | | |
|---|---|---|
| 2,750,395 A | 6/1956 | Phillips et al. .............. 260/348 |
| 2,890,194 A | 6/1959 | Phillips et al. ............. 260/45.4 |
| 4,412,048 A | 10/1983 | Dixon et al. ................. 525/524 |
| 4,513,039 A * | 4/1985 | Esmay |
| 4,600,640 A | 7/1986 | Olson ......................... 428/332 |
| 4,729,938 A * | 3/1988 | Tajima et al. |
| 4,902,578 A * | 2/1990 | Kerr, III |
| 5,328,940 A | 7/1994 | Zimmer ....................... 522/31 |
| 5,334,456 A * | 8/1994 | Noren et al. |
| 5,859,087 A * | 1/1999 | Zahora |
| 5,891,530 A * | 4/1999 | Wright |
| 5,905,099 A * | 5/1999 | Everaerts et al. |

FOREIGN PATENT DOCUMENTS

| | | |
|---|---|---|
| DE | 4 408 487 | 9/1995 |
| EP | 0 326 917 | 8/1989 |
| WO | WO95/25138 | 9/1995 |
| WO | WO96/13538 | 5/1996 |

OTHER PUBLICATIONS

Cyracure Cycloaliphatic Epoxides, pp. 1–24.
Rapid Cure Hyrid Formulations for High Humidity pp. 1–15.
Advances in Polymer Science, vol. 78 (1986) pp. 61–81.

* cited by examiner

Primary Examiner—Susan W. Berman
(74) Attorney, Agent, or Firm—Wayne C. Jaeschke; Stephen D. Harper

(57) ABSTRACT

Solvent-free and water-free radiation-curable primers based on hydroxy-functional prepolymers and cycloaliphatic epoxides or based on hydroxy-functional prepolymers and olefinically unsaturated compounds or based on epoxides and vinyl ethers together with cationic or free-radical initiators may be applied in the same manner as conventional commercial solvent-free laminating adhesives and, for many coatings, allow subsequent in-line coating without there being any need to evaporate solvent or water from the primer coating.

30 Claims, No Drawings

SOLVENTLESS PRIMERS WHICH ARE HARDENABLE BY RADIATION

BACKGROUND OF THE INVENTION

1. Field of the Invention

This invention relates to primer compositions which are solvent-free and contain cationically and/or free-radically curable crosslinking systems and to the production and use thereof.

2. Discussion of Related Art

Coupling agents (primers), which make it possible for the coating to adhere to the substrate or distinctly improve adhesion, are used in many coatings. Primers are used on difficult to coat substrates, for example when coating flexible support materials (films) and rigid support materials. In particular, primers are used when coating these materials with polyvinylidene chloride (PVDC), hot melts (hot melt adhesives), heat sealing lacquers, silicone, printing inks and lacquers, metallisation and extrusion coating/extrusion lamination with polyethylene (PE) or polypropylene (PP).

According to the prior art, primer compositions containing solvents are used in such coatings, with the primer compositions, for example, containing moisture-curing polyurethane prepolymers as the reactive component in addition to the solvents. While these primer compositions containing solvents do indeed very adequately fulfil the technical requirements placed upon them, costly recirculation or incineration plants are necessary due to today's stringent environmental requirements relating to the prevention or minimisation of volatile organic solvent emissions.

In recent times, many aqueous dispersions or solvents have thus been proposed for this purpose. DE-A-4408487 thus describes an aqueous polyurethane primer composition consisting of a dispersion of an OH-functional polyurethane prepolymer and an isocyanate component. This primer composition is suitable for PVC products, especially for PVC profiles, for laminating PVC, polyether sulphone, polyolefin or polymethacrylate films with plastics products, in particular in conjunction with the use of (reactive) hot melt adhesives. These primer compositions fulfil the requirement of the absence of organic solvents, but considerable effort must be expended to dry the aqueous primer layer when it is applied in large areas in high speed coating machines. A further difficulty with temperature-sensitive substrates is that high drying temperatures cannot be used, such that short drying or flashing-off times are virtually impossible to achieve with aqueous systems.

SUMMARY OF THE INVENTION

The object thus arose of providing a primer composition which is both substantially free of volatile organic solvents and free of water as a solvent or dispersant and which is suitable for providing a coupling coating when coating temperature-sensitive substrates of the above-stated type. Such a primer composition should fulfil the following requirements:

be substantially free of organic solvents and/or water, have a processing temperature of below 150° C., preferably of below 100° C., have a processing viscosity of below 5000 mPa·s at the processing temperature, primer application rates of substantially less than 5 g/m$^2$ should be possible on conventional processing plant, the coupling agent layer should exhibit elevated cohesion and low surface tack, both "in-line" priming and "off-line" priming should be possible.

"In-line" priming is taken to mean that, after coating with the primer composition, a further coating is applied onto the primer layer in a single operation. In "off-line" priming, the primer is first applied and a further coating applied at a later time.

This object has been achieved according to the invention by the provision of solvent-free, radiation-curable compositions which are applied in the same way as conventional commercial solvent-free laminating adhesives, wherein according to the invention these compositions have a viscosity of below 5000 mpa·s at temperatures of below 100° C. According to the invention, immediately after application of the primer, the molecular weight of the composition is dramatically increased by UV irradiation or electron beam irradiation. Coating may then proceed in a single operation (in-line) or in two operations (off-line) with intermediate winding of the substrate web onto a reel. In the case of the off-line method, the primer must not have any surface tack during winding, so avoiding adhesion onto the reverse side of the support, as the roll of the web material would otherwise block.

DETAILED DESCRIPTION OF THE INVENTION

The radiation-curable primers may be cured cationically, free-radically or by a combination of both polymerisation mechanisms (hybrid systems).

Radiation-curable polymer systems based on cycloaliphatic epoxides are known in principle. The company literature Cyracure, *Cycloaliphatic epoxides* from Union Carbide Chemicals & Plastics Co. Inc. thus describes cationic, UV-curable binder systems based on mixed cycloaliphatic epoxides, polycaprolactone diols, reactive diluents based on aliphatic or cycloaliphatic epoxides together with triarylsulphonium hexafluorophosphate salts or triarylsulphonium hexafluoroantimonate salts as the photoinitiator. Stated applications are lacquers for cans and lids, decorative metal coatings, lithographic printing inks, paper coating and the like. This company literature makes no mention of the applicability of such compositions as primers for the purposes of the present invention.

Free-radically curing systems, which cure in the presence of a photoinitiator after UV irradiation or without a photoinitiator after electron irradiation, are also known in principle. EP-A-326917, for example, thus describes adhesive mixtures which contain a polyurethane polymer containing hydroxyl groups and having a molecular weight of preferably 100000 to 300000, photopolymerisable, ethylenically unsaturated compounds, optionally a photoinitiator and conventional adhesive auxiliaries (surfactants, adhesion promoters, tackifiers). These adhesive mixtures are radiation-curable and thermally activatable. These compositions are suitable for use as adhesives for adhesive bonding of plastics materials, no mention being made as to their suitability as a coupling agent coating for difficult to coat substrates.

Hybrid systems, which cure by a combination of cationic and free-radical polymerisation, consist, for example, of vinyl ethers and acrylate oligomers and contain both a cationic and a free-radical photoinitiator. Such hybrid formulations are described, for example, in the company literature *Rapid Cure Hybrid Formulations for High Humidity Environments* from the company International Specialty Products. Stated applications are as UV-curable clear lacquers for paper, plasticised PVC, polycarbonate and polyester.

Radiation-curable compositions based on epoxy compounds, hydroxy-terminated polyurethane polymer and a photoinitiator and the use thereof as a laminating adhesive are described in U.S. Pat. No. 5,328,940. The teaching of U.S. Pat. No. 5,328,940 makes no disclosure in relation to solvent-free, radiation-curable primer compositions.

The free-radically curing primer compositions according to the invention are based on styrene, acrylate and/or methacrylate monomers, optionally in the presence of acrylate- or methacrylate-functionalised prepolymers.

Examples of preferably used ethylenically unsaturated components of the above-stated type are butyl, hexyl, ethylhexyl, dodecyl, dicyclopentadienyl, hydroxyethyl, 2-hydroxypropyl, 4-hydroxybutyl, 2-methoxyethyl, 2-ethoxyethyl-2-(2-ethoxyethoxy)ethyl, tetrahydrofurfuryl acrylate, N,N-dimethacrylamide, ethylene glycol diacrylate, butanediol diacrylate, hexanediol diacrylate, neopentyl glycol diacrylate, trimethylolpropane triacrylate, pentaerythritol tetraacrylate and the corresponding methacrylates, optionally vinylpyrrolidone and divinylimidazole.

Possible further constituents of these free-radically curing systems are hydroxy-functional polyurethane prepolymers which are produced in a manner known per se from polyether polyols or polyester polyols and diisocyanates with a stoichiometric excess of the OH component.

In the event of curing by UV light, these primer compositions additionally contain suitable photoinitiators, for example benzoin, benzoin methyl ether, benzoin isopropyl ether, benzophenone, Michler's ketone, 2-hydroxy-2-methylpropionphenone, benzil dimethyl ketal, acetophenone, α,α-dimethoxyacetophenone or similar compounds.

The molecular weight of the OH-functional polyurethanes and the ratio of generally low-viscosity and ethylenically unsaturated components must here be adjusted relative to each other such that the processing viscosity at the processing temperature remains distinctly below 5000 mpa·s. Especially in the case of off-line priming, care must additionally be taken to ensure that the primer layer no longer exhibits any surface tack after irradiation.

Due to their low sensitivity to oxygen, cationic systems or hybrid systems are particularly preferred for the radiation-curable primer compositions according to the invention. Cationic systems are here prepared on the basis of cycloaliphatic polyepoxides and optionally aliphatic or cycloaliphatic epoxides as reactive diluents, hydroxy-functional polyesters and/or hydroxy-functional polyurethanes and suitable photoinitiators.

Examples of suitable cycloaliphatic epoxides are the epoxides of cycloaliphatic esters of dicarboxylic acids, such as bis-(3,4-epoxycyclohexylmethyl) oxalate, bis-(3,4-epoxycyclohexylmethyl) adipate, bis-(3,4-epoxy-6-methylcyclohexylmethyl) adipate, bis-(3,4-epoxycyclohexylmethyl) pimelate. Further suitable diepoxides of cycloaliphatic esters are described, for example, in U.S. Pat. No. 2,750,395.

Further suitable cycloaliphatic epoxides are, for example, 3,4-epoxycyclohexylmethyl-3,4-epoxycyclohexane carboxylate, bis-(3,4-epoxycyclohexyl) adipate, 3,4-epoxy-1-methylcyclohexylmethyl-3,4-epoxy-1-methylcyclohexane carboxylate. Further suitable cycloaliphatic epoxides are described, for example, in U.S. Pat. No. 2,890,194.

Reactive diluents which may be used are either mixtures of low viscosity cycloaliphatic epoxides or preferably 1,2-epoxyalkanes, such as for example 1,2-epoxyhexadecane or the monofunctional glycidyl ethers of alkanols.

Polyols which may be used are per se known OH-functional polyesters based on aliphatic or aromatic dicarboxylic acids and low molecular weight glycols, for example polyesters based on adipic acid, sebacic acid, isophthalic acid and glycols such as ethylene glycol, diethylene glycol, triethylene glycol, neopentyl glycol, hexanediol and the like. Hydroxy-terminated polycaprolactones known per se may also be used.

Further OH-terminated prepolymers may be the per se known reaction products of polyether polyols and/or polyester polyols and diisocyanates, provided that the molecular weight is low enough in order to ensure a low viscosity primer composition.

Photoinitiators which may be used are in principle any so-called "onium" salts, as described, for example, by F. Lohse and H. Zweifel in *Adv. Polym. Sci.* 1986, pp. 61–81. The mixed triarylsulphonium hexafluoroantimonates and the mixed triarylsulphonium hexafluorophosphates are in particular preferred, as are commercially available, for example, under the name Cyracure from Union Carbide.

Radiation curing may be performed using conventional commercial electron beam curing units and UV polymerisation units. Some preferred practical examples illustrate the invention in greater detail below.

EXAMPLE 1

A mixture was produced from 59.83 wt. % of a polyester based on isophthalic acid, adipic acid, diethylene glycol and having an OH value of 23.5 (DIN 53240), 19.94 wt. % of a polyester based on adipic acid, neopentyl glycol, hexanediol, ethylene glycol and 6-hydroxyhexanoic acid (OH value 21), 17.31 wt. % of 3,4-epoxycyclohexylmethyl-3,4-epoxycyclohexane carboxylate and 2.91 wt. % of a mixed triarylsulphonium hexafluorophosphate (Cyracure UVI 6990, Union Carbide). This primer had a Brookfield viscosity of 3800 mPa·s at 80° C. (Brookfield RVTD-II, spindle 27).

EXAMPLE 2

A mixture was produced from 31.81 wt. % of 3,4-epoxycyclohexylmethyl-3,4-epoxycyclohexane carboxylate, 3.27 wt. % of a polycaprolactone triol (OH value 307.5), 2.90 wt. % of photoinitiator Cyracure UVI 6990 and an OH-terminated polyurethane prepolymer based on 9.18 wt. % of polypropylene glycol (OH value 256), 42.34 wt. % of a hydroxy-functional polyester having an OH value of 111 and 11.50 wt. % of 4,4'-diphenylmethane diisocyanate. The Brookfield viscosity of this primer was 2400 mPa·s at 70° C. (RVTD-II, spindle 27).

EXAMPLE 3 (Comparative Example)

An aqueous polyurethane dispersion was produced with an aliphatic isocyanate curing agent based on Liofol A 8219-21/UR5888-21 (commercial products of Henkel) in a ratio of 100:6.

EXAMPLE 4 (Comparison)

Liofol UK 4500 from Henkel was used as a comparative example of a primer containing solvent and based on a moisture-curing polyurethane prepolymer.

Testing of Primers

The primers according to Examples 1 to 4 were used for PVDC coating an oriented polypropylene (OPP) film (20 μm, MB200 from Mobil). To this end, the primers were applied using a multi-roller applicator at 70° C. (primer 2)

or 80° C. (primer 1) onto the corona-pretreated side of the OPP film. The primers according to the invention were applied at a machine speed of 5 m/min, wherein the coating was passed under a mercury vapour lamp with a radiant power of approx. 30 W/cm. In the case of the solvent-based or aqueous primers, the primer layers were not irradiated, but the solvent or water was completely removed by evaporation.

PVDC coating was performed with Diofan 193D from BASF, to which 2% of lubricant dispersion and 0.2% of Syloid 244 from Grace were added. The application rate of the PVDC layer was 4.5 to 5 g/m$^2$ (dry).

The effectiveness of the primer in these coatings was tested by heat sealing the PVDC side of the coated film to itself, wherein heat sealing was performed at 140° C./0.25 s/2.5 bar. The seam produced in this manner was tested in a tensile tester at a testing speed of 150 mm/min on strips 15 mm in width. The following Table shows the test results.

Results

| Primer Example | Application rate [g/m$^2$] | PVDC coating method[1] | Peel value (maximum)[2] [N/15 mm] | Peel strength[2] [N/15 mm] |
|---|---|---|---|---|
| — | — | n.a. | 1.8 | 0.4 |
| 1 | 1.0 | in-line | 2.4 | 1.5 |
| 1 | 1.0 | in-line | 2.8 | 2.0 |
| 2 | 1.0 | in-line | 3.0 | 2.2 |
| 2 | 1.0 | off-line | 3.1 (sub) | 3.1 (sub) |
| 3 (Comparison) | 1.5 | after drying | 2.6 | 1.6 |
| 4 (Comparison) | 0.8 | after drying | 2.3 | 1.3 |

[1]n.a. = not applicable; in-line = immediately after irradiation; off-line = 24 h after priming; after drying = after drying of the primer layer.
[2]Peel resistance to DIN 53357
sub = substrate failure, in this case OPP film As is evident from the test results, it is possible using the radiation-curable primer compositions according to the invention, to apply the primer at a similarly low rate as is possible with prior art solvent-based or aqueous primers, wherein peel strength, both with regard to the maximum value and the average value, is in some instances considerably better than in the case of the prior art primers.

What is claimed is:

1. A method for improving adhesion between a substrate and a coating layer comprising:
   (a) forming a layer of a solvent free radiation curable primer composition on the substrate wherein the solvent free radiation-curable primer composition comprises at least one composition selected from the group consisting of cationically curable compositions and free-radically curable compositions wherein said radiation-curable primer composition comprises at least two substances selected from the group consisting of aliphatic epoxides, aromatic epoxides, polyols, monools, mono(meth) acrylic functional compounds, poly(meth) acrylic functional compounds, vinyl pyrrolidone and divinyl imidazole, wherein the radiation curable primer composition comprises one or more compounds having olefinically unsaturated double bonds, and a photoinitiator selected from the group consisting of cationic photoinitiators, free radical photoinitiators and mixtures thereof; and a free-radical initiator selected from the group consisting of hydroperoxides, peroxides and azo compounds, wherein the at least two substances can comprise different substances from the same member;
   (b) applying radiation to cure the primer composition and provide a substrate with a cured primer coated surface; and
   (c) applying a layer of a coating to the cured primer surface.

2. The method of claim 1 wherein the radiation curable primer composition has a viscosity of less than 5000 mPa·s, measured using a Brookfield RVTD-II viscometer, at a processing temperature of less than 150° C.

3. The method of claim 1 wherein the radiation-curable primer composition comprises a cationically curable composition comprised of one or more photoinitiators and one or more substances selected from the group consisting of cycloaliphatic epoxides and vinyl ethers.

4. The method of claim 1 wherein the solvent free radiation curable primer comprises at least one cationically curable composition and at least one free-radically curable composition.

5. The method of claim 1 wherein said substrate is selected from the group consisting of metal foils and plastic films.

6. The method of claim 1 wherein said coating is selected from the group consisting of hot melt adhesives, lacquers, metallizing coatings, polyethylene films, polypropylene films, polyvinylidene chloride dispersions, and printing inks.

7. The method of claim 1 wherein said curing is accomplished by a means selected from the group consisting of ultra violet irradiation and electron beam irradiation.

8. The method of claim 1 wherein the radiation-curable primer composition comprises at least one canonically curable composition comprised of one or more photoinitiators and one or more substances selected from the group consisting of cycloaliphatic epoxides and vinyl ethers; and wherein the radiation-curable primer composition has a viscosity of less than 5000 mPa·s, measured using a Brookfield RVTD-II viscometer, at a processing temperature of less than 150° C.

9. The method of claim 8 wherein said processing temperature is less than 100° C.

10. The method of claim 8 wherein at least one cationically curable composition and at least one free-radically curable composition are present.

11. The method of claim 8 wherein the free-radically curable composition is comprised of at least one monomer selected from the group consisting of styrene, acrylates and methacrylates.

12. The method of claim 8 wherein the cationically curable composition comprises an onium salt photoinitiator.

13. The method of claim 8 wherein the radiation curable primer composition is additionally comprised of a hydroxy-functional polyurethane prepolymer.

14. The method of claim 8 wherein the radiation-curable primer composition is additionally comprised of a hydroxy-functional polyester.

15. The method of claim 8 wherein the primer composition comprises at least one cycloaliphatic epoxide selected from the group consisting of bis(3,4-epoxy-cyclohexylmethyl) oxalate, bis-(3,4-epoxycyclohexylmethyl)adipate, bis-(3,4-epoxy-6-methylcyclohexylmethyl)adipate, bis-(3,4-epoxycyclohexylmethyl)pimelate, 3,4epoxy-cyclohexylmethyl-3,4-expoxycyclohexane carboxylate, bis-(3,4-epoxycyclohexyl)adipate, 3,4-epoxy-1-methyl cyclohexylmethyl-3,4-epoxy-1-methyl cyclohexane carboxylate.

16. The method of claim 8 for improving adhesion between layers of a laminate comprised of a first plastic film, a second plastic film, and an adhesive layer between the first plastic film and the second plastic film wherein the adhesive layer comprises a polyvinylidene chloride dispersion or a hot melt adhesive, wherein the radiation-curable primer composition forms a primer layer between at least one of the first plastic film and the second plastic film and the adhesive layer.

17. The method of claim 16 wherein one or both of the first plastic film and the second plastic film are selected from the group consisting of polyethylene films and polypropylene films.

18. The method of claim 8 for improving adhesion of a coating to a substrate selected from the group consisting of metal foils and plastic films comprising: applying the radiation-curable primer composition to said substrate to form a primer layer, curing said primer layer using a means selected from the group consisting of ultra violet radiation and electron beam radiation to form a cured primer layer, and applying said coating to said cured primer layer.

19. The method of claim 18 wherein said coating is selected from the group consisting of hot melt adhesives, lacquers, metallizing coatings, polyethylene films, polypropylene film, polyvinylidene chloride dispersions, and printing inks.

20. An article prepared by the method of claim 1.

21. The article of claim 20 wherein said substrate is selected from the group consisting of metal foils and plastic films.

22. An article prepared by the method of claim 8 wherein the substrate is selected from the group consisting of metal foils and plastic films having the radiation-curable primer composition of claim 8 in cured form adhered thereto.

23. The article of claim 22 wherein the radiation-curable primer composition in cured form does not exhibit any surface tack.

24. The article of claim 22 wherein said substrate is an oriented polypropylene film.

25. A laminate comprised of a first substrate film, a second substrate film, an adhesive layer between the first substrate film and second substrate film and a primer layer between the adhesive layer and the first substrate film formed by the method of claim 1.

26. A laminate comprised of a first plastic film, a second plastic film, an adhesive layer between the first plastic film and the second plastic film obtained from a polyvinylidene chloride dispersion or hot melt adhesive, and a primer layer between the adhesive layer and the first substrate by the method of claim 8.

27. A method of improving adhesion between layers of a laminate comprised of a first substrate film, a second substrate film and an adhesive coating layer selected from the group consisting of hot melt adhesives and polyvinylidene dispersions between the first and second substrate films, said method comprising the process of claim 1 to form a primer layer between at least one of the first substrate film or the second substrate film and the adhesive coating layer.

28. The method of claim 27 wherein the first substrate film is a plastic film.

29. The method of claim 27 wherein the second substrate film is a plastic film.

30. The method of claim 27 wherein the adhesive layer is selected from the group consisting of hot melt adhesives and polyvinylidene dispersions.

* * * * *

UNITED STATES PATENT AND TRADEMARK OFFICE
CERTIFICATE OF CORRECTION

PATENT NO.    : 6,350,344 B1
DATED         : February 26, 2002
INVENTOR(S)   : Kinzelmann et al.

It is certified that error appears in the above-identified patent and that said Letters Patent is hereby corrected as shown below:

Column 6,
Line 30, delete "canonically", insert therefor -- cationically --.
Line 57, after "bis" and before "(3,4-epoxy-", insert therefor -- - --.
Line 61, delete "3,4epoxy-" and insert therefor -- 3,4-epoxy- --.
Line 62, delete "cyclohexylmethyl-3,4-expoxycyclohexane", and insert therefor
-- cyclohexylmethyl-3,4-epoxycyclohexane --.

Column 7,
Line 23, delete "film", and insert therefor -- films --.

Signed and Sealed this

Twenty-ninth Day of July, 2003

JAMES E. ROGAN
*Director of the United States Patent and Trademark Office*